(12) United States Patent
Shin et al.

(10) Patent No.: US 12,364,029 B2
(45) Date of Patent: Jul. 15, 2025

(54) IMAGE SENSING DEVICE INCLUDING LIGHT RECEPTION ALIGNMENT MARKS

(71) Applicant: SK hynix Inc., Icheon-si (KR)

(72) Inventors: Seok Jae Shin, Icheon-si (KR); Woo Yung Jung, Icheon-si (KR); Jae Hyun Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 369 days.

(21) Appl. No.: 17/228,229

(22) Filed: Apr. 12, 2021

(65) Prior Publication Data

US 2022/0085091 A1  Mar. 17, 2022

(30) Foreign Application Priority Data

Sep. 15, 2020  (KR) .................. 10-2020-0118257

(51) Int. Cl.
*H01L 23/544* (2006.01)
*H01L 23/00* (2006.01)
(Continued)

(52) U.S. Cl.
CPC ......... *H10F 39/026* (2025.01); *H01L 23/544* (2013.01); *H01L 24/08* (2013.01);
(Continued)

(58) Field of Classification Search
CPC ............... H01F 10/3286; H01F 10/329; H01L 2224/0224; H01L 2223/54426;
(Continued)

(56) References Cited

U.S. PATENT DOCUMENTS 9,177,981 B2  11/2015  Nishizawa
9,548,290 B2  1/2017  Wakiyama et al.
(Continued)

FOREIGN PATENT DOCUMENTS

CN  102484116 A  5/2012
CN  102804378 A  11/2012
(Continued)

OTHER PUBLICATIONS

Request for the Submission of an Opinion for KR Appl. No. 10-2020-0118257, mailed on Nov. 26, 2024, 10 pages with English translation.

(Continued)

*Primary Examiner* — Shaun M Campbell
*Assistant Examiner* — Teresa M. Arroyo
(74) *Attorney, Agent, or Firm* — Perkins Coie LLP

(57) ABSTRACT

An image sensing device includes an upper substrate configured to include a pixel region and a first peripheral region located outside the pixel region, a lower substrate configured to include a logic region and a second peripheral region located outside the logic region, the logic region configured to generate an image based on the electrical signals from the unit pixels, light reception elements disposed over the upper substrate and configured to transmit the incident light to the pixel region, an insulation layer disposed between the upper substrate and the lower substrate, a light reception alignment mark disposed in the first peripheral region and configured to assist positioning of the light reception elements, and an alignment pattern disposed between the first peripheral region and the second peripheral region and in the insulation layer. The alignment pattern is configured to absorb light used to measure the light reception alignment mark.

20 Claims, 7 Drawing Sheets

(51) Int. Cl.
*H10F 39/00* (2025.01)
*H10F 39/18* (2025.01)

(52) U.S. Cl.
CPC ....... *H10F 39/182* (2025.01); *H10F 39/8053* (2025.01); *H10F 39/8063* (2025.01); *H10F 39/809* (2025.01); *H01L 2223/54426* (2013.01); *H01L 2224/0224* (2013.01); *H01L 2224/08145* (2013.01)

(58) Field of Classification Search
CPC .............. H01L 23/544; H01L 27/14627; H01L 27/14605; H01L 27/14603; H10F 39/026; H10F 39/182; H10F 39/8053; H10F 39/8063; H10F 39/809; H10F 39/018; H10F 39/811; H10F 39/8023; H10F 39/802

See application file for complete search history.

(56) References Cited

U.S. PATENT DOCUMENTS

| | | | | |
|---|---|---|---|---|
| 9,773,831 | B1* | 9/2017 | Yang | H01L 27/14621 |
| 10,249,665 | B2 | 4/2019 | Yamamoto et al. | |
| 2002/0003310 | A1* | 1/2002 | Barr et al. | H01L 23/544 |
| | | | | 257/797 |
| 2011/0062540 | A1* | 3/2011 | Saito | H01L 27/1464 |
| | | | | 438/69 |
| 2012/0153419 | A1* | 6/2012 | Itonaga | H01L 21/76898 |
| | | | | 438/66 |
| 2012/0199930 | A1* | 8/2012 | Hayashi | H01L 27/14634 |
| | | | | 257/E31.127 |
| 2012/0217374 | A1* | 8/2012 | Nishizawa | H01L 27/14618 |
| | | | | 257/E23.141 |
| 2012/0313236 | A1* | 12/2012 | Wakiyama | H01L 25/50 |
| | | | | 257/734 |
| 2013/0009268 | A1 | 1/2013 | Testa et al. | |
| 2013/0075607 | A1* | 3/2013 | Bikumandla | H01L 27/14636 |
| | | | | 257/E31.127 |
| 2013/0284885 | A1* | 10/2013 | Chen | H01L 27/14618 |
| | | | | 250/208.1 |
| 2015/0076649 | A1* | 3/2015 | Kim | H01L 27/14634 |
| | | | | 257/446 |
| 2015/0102445 | A1* | 4/2015 | Testa | H01L 23/544 |
| | | | | 257/443 |
| 2018/0277605 | A1 | 9/2018 | Maruyama | |
| 2020/0135793 | A1* | 4/2020 | Torii | H01L 27/1469 |
| 2021/0036179 | A1* | 2/2021 | Sung et al. | H01L 31/18 |

FOREIGN PATENT DOCUMENTS

| | | |
|---|---|---|
| CN | 102820284 A | 12/2012 |
| CN | 104434152 A | 3/2015 |
| KR | 10-2012-0137238 A | 12/2012 |
| KR | 10-2019-0140692 | * 12/2019 |

OTHER PUBLICATIONS

First Office Action for CN Appl. No. 202110306779.X, mailed on Apr. 22, 2025, 11 pages with English translation.

* cited by examiner

IMAGE SENSING DEVICE INCLUDING LIGHT RECEPTION ALIGNMENT MARKS

CROSS-REFERENCE TO RELATED APPLICATION

This patent document claims the priority and benefits of Korean patent application No. 10-2020-0118257, filed on Sep. 15, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to an image sensing device that includes alignment marks that are configured to assist positioning of some elements. In some implementations, the alignment marks can be located freely regardless of positions of lower patterns that are included in the image sensing device.

In accordance with an embodiment of the disclosed technology, an image sensing device may include an upper substrate configured to include a pixel region and a first peripheral region located outside the pixel region, the pixel region including unit pixels configured to generate electrical signals through conversion of incident light, a lower substrate configured to include a logic region and a second peripheral region located outside the logic region, the logic region coupled to receive the electrical signals from the unit pixels and configured to generate an image based on the electrical signals from the unit pixels, light reception elements disposed over the upper substrate and configured to transmit the incident light to the pixel region, an insulation layer disposed between the upper substrate and the lower substrate, a light reception alignment mark disposed in the first peripheral region and configured to assist positioning of the light reception elements formed over a first surface of the upper substrate in the pixel region, and an alignment pattern disposed between the first peripheral region and the second peripheral region and in the insulation layer. The alignment pattern is configured to absorb light used to measure the light reception alignment mark.

In accordance with another embodiment of the disclosed technology, an image sensing device may include a semiconductor substrate configured to include a pixel region and a peripheral region located outside the pixel region, the pixel region including a plurality of photoelectric conversion elements configured to generate electrical signals through conversion of light, a plurality of light reception elements formed over a first surface of the semiconductor substrate, and configured to transmit incident light to the photoelectric conversion elements, an insulation layer disposed over a second surface located opposite to the first surface, a light reception alignment mark disposed in the peripheral region and configured to assist positioning of the light reception elements, and an alignment pattern formed in the insulation layer to overlap with the light reception alignment mark. The alignment pattern may include a plurality of dot patterns that are disposed in different sub-layers of the insulation layer.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device and the disclosed features may be implemented to substantially address one or more issues due to limitations and disadvantages of various image sensing devices. Some implementations of the disclosed technology suggest designs of an image sensing device which provides more flexibility for locations for forming alignment marks that are required for a subsequent process. In some implementations, the alignment marks can be formed freely without being limited based on positions of lower patterns.

Figure 1:
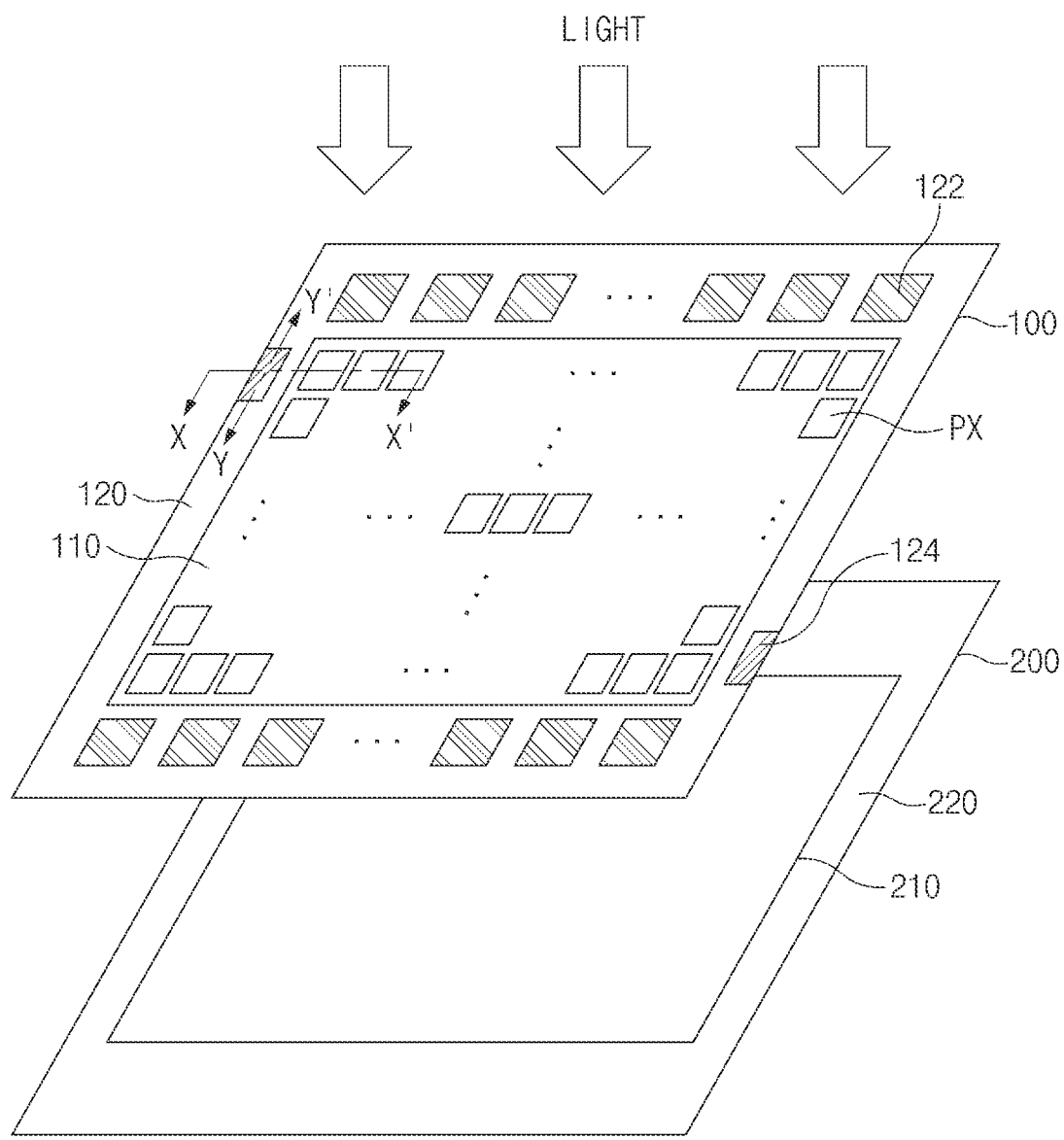
FIG. 1 is a schematic diagram illustrating an example layout of a stacked image sensing device based on some implementations of the disclosed technology.
Figure 2:
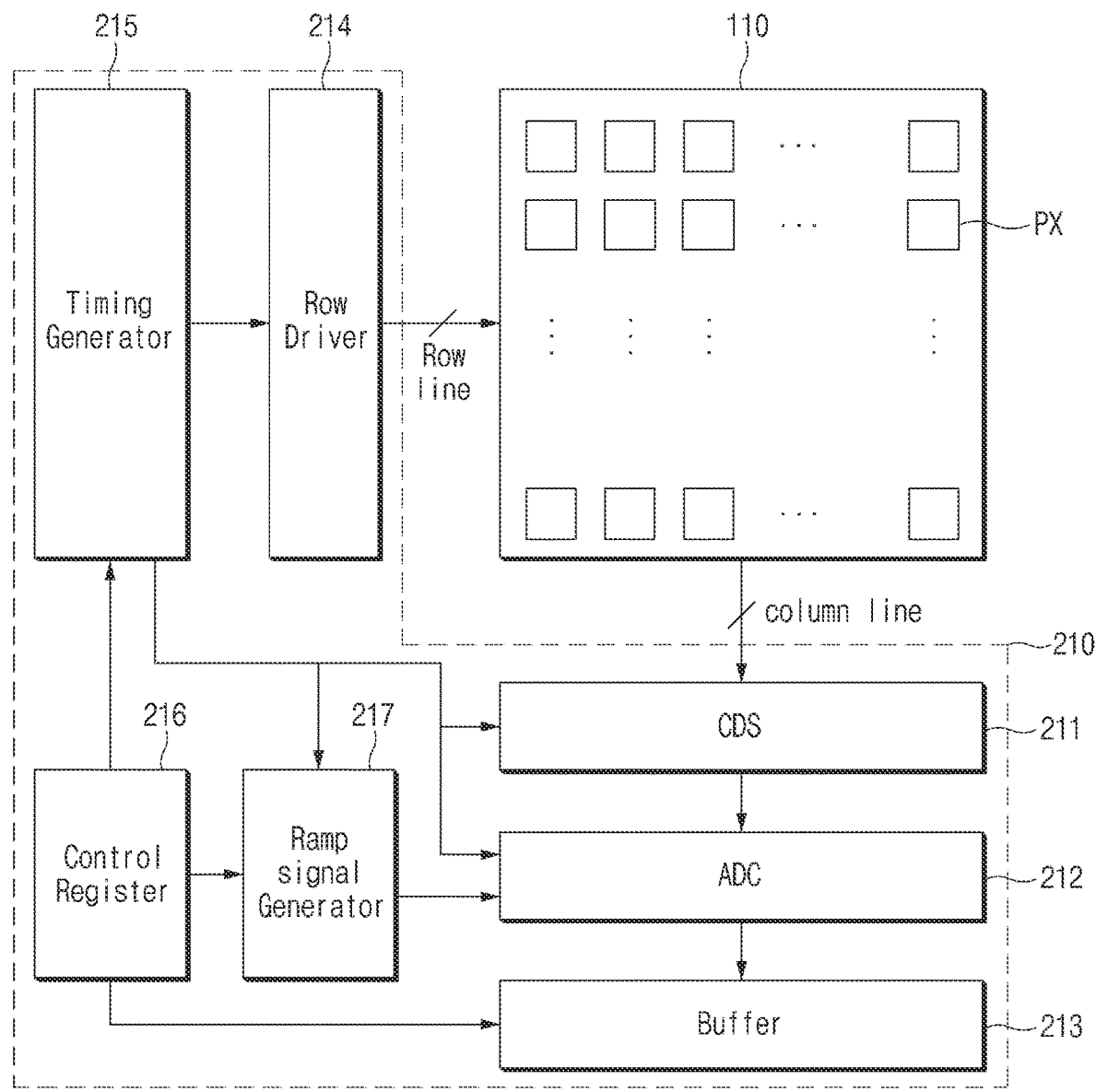
FIG. 2 is a schematic diagram illustrating an example layout of an image sensing device based on some implementations of the disclosed technology.

FIG. 1 is a schematic diagram illustrating an example layout of a stacked image sensing device based on some implementations of the disclosed technology. FIG. 2 is a schematic diagram illustrating an example layout of an image sensing device based on some implementations of the disclosed technology.

Referring to FIGS. 1 and 2, the image sensing device may include an upper substrate 100 and a lower substrate 200 that are stacked in a vertical direction. Each of the upper substrate 100 and the lower substrate 200 may include a semiconductor substrate.

The upper substrate 100 may include a pixel region 110 and a peripheral region 120.

The pixel region 110 may include a plurality of unit pixels (PXs) arranged in succession. Each of the unit pixels (PXs) may generate an electrical signal (i.e., pixel signal) corresponding to incident light through photoelectric conversion of the incident light.

Each unit pixel (PX) may include a photoelectric conversion element configured to generate photocharges through conversion of light, a plurality of light reception elements configured to transmit incident light to the photoelectric conversion elements, and a plurality of pixel transistors configured to output a pixel signal corresponding to photocharges generated by the photoelectric conversion element. Each of the photoelectric conversion elements may include a photodiode (PD), and may be formed in the upper substrate 100. The light reception elements may be structured to spatially correspond to underlying photoelectric conversion elements, respectively, to receive and transmit light and to direct the received incident light to their corresponding photoelectric conversion elements, respectively. For example, the light reception elements may include microlenses or optical filters in various implementations. In an implementation where each light reception element includes a microlens and a color filter, the light reception element is configured to converge incident light onto a corresponding photoelectric conversion element, and the color filter is configured to filter out light having a specific color from incident light having penetrated the microlens. The light reception elements may be formed over a first surface (i.e., a top surface of FIG. 1) of the upper substrate 100. The pixel transistors may include a transfer transistor, a reset transistor, a source follower transistor, and a selection transistor. The pixel transistors may be disposed over a second surface (i.e., a bottom surface of FIG. 1) facing or opposite to the first surface of the upper substrate 100.

The peripheral region 120 may be defined as a region located outside the pixel region 110 in the upper substrate 100. The peripheral region 120 may include a residual region that is not removed by dicing, from among a scribe region. In some implementations, the peripheral region 120 may surround the pixel region 110 in the upper substrate 100.

The peripheral region 120 may include a plurality of pads 122 and a plurality of alignment marks 124. The pads 122 may transmit and receive signals to and from an external device by communicating with the external device, and may receive a power-supply voltage from the external device. The alignment marks 124 are provided and used for positioning of a light reception element and for properly aligning the spatial position of the light reception element with respect to its corresponding photoelectric conversion element in a process of forming the light reception elements above the photoelectric conversion elements where alignment light (such as laser light) is used to measure the locations of alignment marks 124 during the fabrication process. In order to distinguish the alignment marks 124 from other alignment marks designed for other purposes, the alignment marks 124 will hereinafter be referred to as light reception alignment marks for convenience of description.

The pad 122 may include metal, and may be formed over the first surface of the upper substrate 100. The light reception alignment mark 124 may be formed in a manner that a trench etched to a predetermined depth from the first surface of the upper substrate 100 is buried with an insulation material. The light reception alignment mark 124 may be formed in a scribe region or a chip region located inside the scribe region. When the light reception alignment mark 124 is formed in the scribe region, the light reception alignment mark 124 shown in FIG. 1 may be a residual region that is not removed by dicing and remains as part of the final imaging device.

The lower substrate 200 may be disposed below the upper substrate 100 such that the lower substrate 200 and the upper substrate 100 are stacked in a vertical direction. In this case, the lower substrate 200 may include a logic region 210 and a peripheral region 220.

The logic region 210 may receive pixel signals from the unit pixels (PXs) of the pixel region 110, may process the received pixel signals using a predefined logic, and may thus form an image based on the processed pixel signals. The logic region 210 may include a correlated double sampler (CDS) 211, an analog-to-digital converter (ADC) 212, a buffer 213, a row driver 214, a timing generator 215, a control register 216, and a ramp signal generator 217.

As discussed above, each unit pixel PX may output the pixel signal to the correlated double sampler (CDS) 211. CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 211 may sequentially sample and hold voltage levels of the reference signal and the image signal, which are provided to each of a plurality of column lines from the pixel array 110. For example, the correlated double sampler (CDS) 211 may perform sampling of a reference voltage level and a voltage level of the received pixel signal in response to a clock signal received from the timing generator 215, and may transmit an analog signal corresponding to a difference between the reference voltage level and the voltage level of the received pixel signal to the analog-to-digital converter (ADC) 212.

The analog-to-digital converter (ADC) 212 may be used to convert analog CDS signals to digital signals. In some implementations, the ADC 212 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 212 may convert the correlated double sampling signal generated by the CDS 211 for each of the columns into a digital signal, and output the digital signal. The ADC 212 may perform a counting operation and a computing operation based on the correlated double sampling signal for each of the columns and a ramp signal received from the ramp signal generator 800. In this way, the ADC 212 may eliminate or reduce noises such as reset noise arising from the imaging pixels when generating digital image data.

The ADC 212 may include a plurality of column counters. Each column of the pixel array 110 is coupled to a column counter, and image data can be generated by converting the correlated double sampling signals received from each column into digital signals using the column counter. In another embodiment of the disclosed technology, the ADC 212 may include a global counter to convert the correlated double sampling signals corresponding to the columns into digital signals using a global code provided from the global counter.

The buffer 213 may temporarily hold or latch each of the digital signals received from the analog-to-digital converter (ADC) 212, may sense or detect and amplify each of the digital signals, and may output each of the amplified digital signals. Therefore, the buffer 213 may include a memory (not shown) and a sense amplifier (not shown). The memory may store the count value, and the count value may be associated with output signals of the plurality of unit pixels PXs. The sense amplifier may sense and amplify each count value received from the memory.

The row driver 214 may be used to drive the pixel array 110 in response to an output signal of the timing generator 215. In some implementations, the row driver 214 may select one or more imaging pixels arranged in one or more rows of the pixel array 110. The row driver 214 may generate a row selection signal to select one or more rows among the plurality of rows. The row driver 214 may sequentially enable the pixel reset signal for resetting imaging pixels corresponding to at least one selected row, and the transmission signal for the pixels corresponding to the at least one selected row.

The timing generator 215 may generate a timing signal to control the row driver 214, the correlated double sampler (CDS) 211, the analog-to-digital converter (ADC) 212, and the ramp signal generator 217.

The control register 216 may generate control signals to control the ramp signal generator 217, the timing generator 215, and the buffer 213.

The ramp signal generator 217 may generate a ramp signal in response to a control signal of the control register 216 and a timing signal received from the timing generator 215, and may output the ramp signal to the analog-to-digital converter (ADC) 212.

The peripheral region 220 may be defined as a region located outside the logic region 210 in the lower substrate 100. The peripheral region 220 may include a residual region that is not removed by dicing, from among a scribe region. In some implementations, the peripheral region 220 may surround the logic region 210 in the lower substrate 200.

An insulation layer (not shown) may be disposed between the upper substrate 100 and the lower substrate 200. In the insulation layer, conductive lines for electrically connecting the pixel transistors to logic circuits may be disposed between the pixel region 110 and the logic region 210. In the insulation layer, various patterns (lower patterns), that are used for positioning either in a process of forming the logic region 210 or in a process of stacking the upper substrate 100 and the lower substrate 200, may be disposed in a region between the peripheral regions 120 and 220.

Specifically, in some implementations, in the insulation layer disposed between the peripheral regions 120 and 220, alignment dummy patterns for preventing alignment failure caused by lower patterns in a process of measuring the light reception alignment mark 124 may be formed between the light reception alignment mark 124 and the lower patterns. A detailed description of such alignment dummy patterns will hereinafter be given below.

Figure 3:
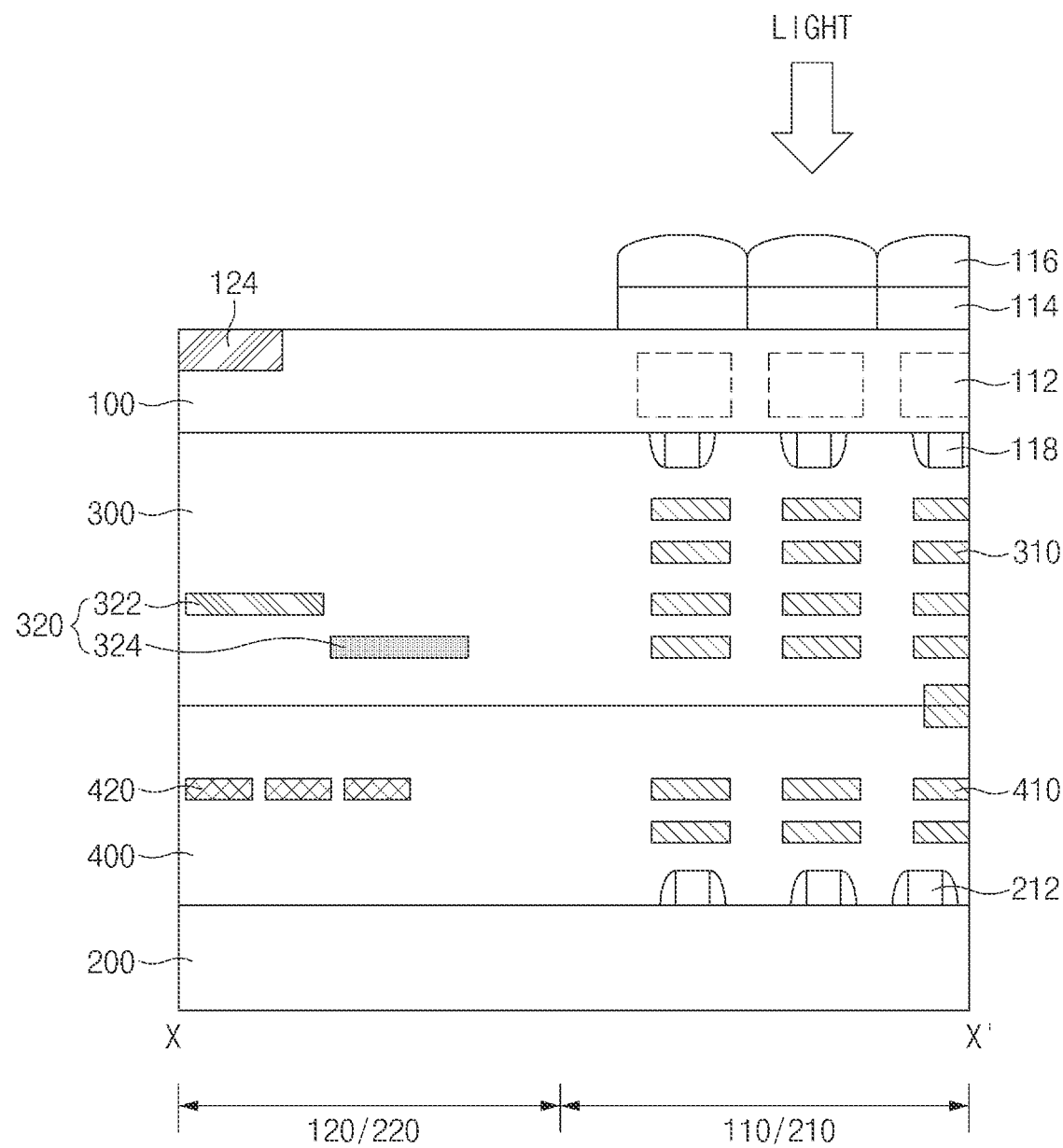
FIG. 3 is a cross-sectional view illustrating an example of the image sensing device taken along the line X-X' shown in FIG. 1 based on some implementations of the disclosed technology.
Figure 4:
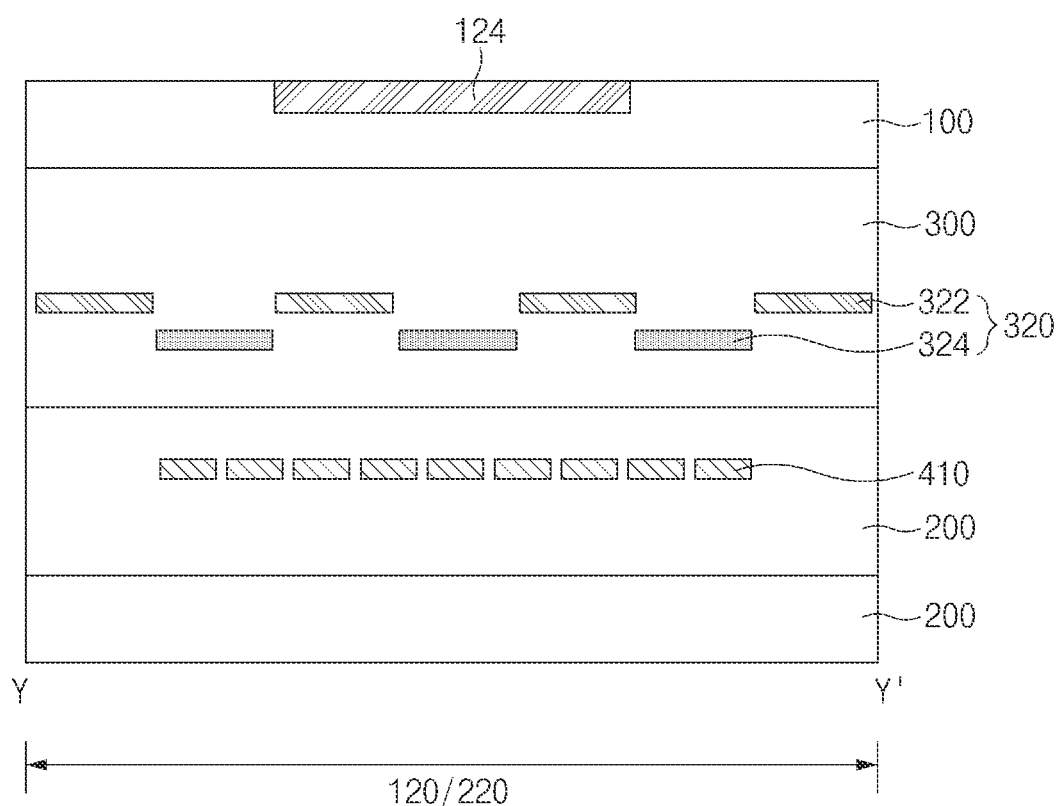
FIG. 4 is a cross-sectional view illustrating an example of the image sensing device taken along the line Y-Y' shown in FIG. 1 based on some implementations of the disclosed technology.

FIG. 3 is a cross-sectional view illustrating an example of the image sensing device taken along the line X-X' shown in FIG. 1 based on some implementations of the disclosed technology. FIG. 4 is a cross-sectional view illustrating an example of the image sensing device taken along the line Y-Y' shown in FIG. 1 based on some implementations of the disclosed technology.

Referring to FIGS. 3 and 4, the image sensing device may include a stacked structure in which the upper substrate 100 including the pixel region 110 and the lower substrate 200 including the logic region 210 are stacked in a vertical direction.

In the pixel region 110 of the upper substrate 100, the photoelectric conversion element 112 may be formed per unit pixel, and light reception elements, each of which includes a color filter 114 and a microlens 116, may be formed over the first surface of the upper substrate 100. In the peripheral region 120 located outside the pixel region 110, the light reception alignment marks 124 may be formed in an upper portion of the upper substrate 100. The light reception alignment marks 124 may refer to marks that are used to perform positioning of light reception elements in the process of forming the light reception elements over the first surface of the upper substrate 100. In some implementations, each of the light reception alignment marks 124 may be formed in a manner that a trench etched to a predetermined depth from the first surface of the upper substrate 100 is buried with an insulation material.

An upper insulation layer 300 may be formed over the second surface of the upper substrate 100, and a lower insulation layer 400 may be formed over the first surface of the lower substrate 200. The upper insulation layer 300 and the lower insulation layer 400 may be stacked to be in contact with each other.

In the upper insulation layer 300 and the lower insulation layer 400, conductive lines 310 and 410 for electrically connecting pixel transistors 118 of the pixel region 110 to logic circuits 212 of the logic region 210 may be formed to be disposed between the pixel region 110 and the logic region 210. In each of the upper insulation layer 300 and the lower insulation layer 400, there is a certain portion disposed between the peripheral regions 120 and 220. Such certain portion will be referred to a peripheral insulation portion and alignment dummy patterns 320 and lower patterns 420 may be formed in the peripheral insulation portions of the upper insulation layer 300 and the lower insulation layer 400.

The alignment dummy patterns 320 may include patterns for preventing alignment failure caused by the lower patterns 420 in the process of measuring the light reception alignment marks 124. For example, the alignment dummy patterns 320 may include patterns for preventing laser beams used to measure the light reception alignment mark 124 in an alignment process from being reflected by the lower patterns 420.

The lower patterns 420 may include various patterns (lower patterns) used to perform positioning either in the process of forming the logic region 210 or in the process of stacking the upper substrate 100 and the lower substrate 200. In some implementations, the lower patterns 420 may include other patterns designed for other purposes without being limited to the patterns designed for performing of positioning.

The alignment dummy patterns 320 may be disposed between the light reception alignment mark 124 and the lower patterns 420 in a manner that the alignment dummy patterns 320 overlap with the lower patterns 420. For example, the alignment dummy patterns 320 may be formed in the peripheral insulation portion of the upper insulation layer 300, and the lower patterns 420 may be formed in the peripheral insulation portion of the lower insulation layer 400.

In some implementations, if the image sensing device is formed to have a stacked structure of the upper substrate 100 and the lower substrate 200, after the upper substrate 100 and the lower substrate 200 are stacked in a manner that the insulation layers 300 and 400 are in contact with each other, the light reception elements may be formed over the first surface of the upper substrate 100. Therefore, the light reception alignment mark 124 used to perform positioning of the light reception elements may be formed after the upper substrate 100 and the lower substrate 200 are stacked. The light reception alignment mark 124 may be formed in the peripheral region 120 of the upper substrate 100.

In some circumstances, various lower patterns 420 used in previous processes may be have already formed in peripheral insulation portions of the insulation layers 300 and 400. In this case, if the light reception alignment mark 124 is formed over the lower patterns 420 in a manner that the light reception alignment mark 124 overlaps with the lower patterns 420, laser beams used to measure the light reception alignment mark 124 in the alignment process may be reflected or scattered by the lower patterns 420 to generate noise that adversely affects the optical measurement of the light reception alignment marks 124 in spatially aligning the light reception elements with respect to their corresponding photoelectric conversion elements during the fabrication process. Thus, it becomes more difficult to correctly measure the light reception alignment mark 124. Thus, in a design which places the lower patterns 420 below the lower reception alignment mark 124, there would be a higher probability for the alignment failure to occur due to the undesired optical reflection or scattering by the lower patterns 420 at this position.

In general, in order to prevent such alignment failure, in forming the light reception alignment mark 124, the light reception alignment mark 120 is formed not to be over the region in which the lower patterns 420 are formed. Such placement restrictions, however, result in difficulties in fabrication operations. In addition, if there are not enough spaces in width for the image sensing device and regions that satisfy the placement restrictions are insufficiently guaranteed, there is still a possibility of generating such alignment failure.

Some implementations of the disclosed technology can be configured to include the alignment dummy patterns 320 to address or avoid the placement restriction issues and to improve the optical measurement of the light reception alignment marks 124 in spatially aligning the light reception elements with respect to their corresponding photoelectric conversion elements during the fabrication process. In some implementations where an alignment dummy pattern 320 is formed below a corresponding light reception alignment mark 124, laser beams used to measure the light reception alignment marks 124 can be absorbed by the alignment dummy patterns 320 without being introduced into the lower patterns 420. By using such alignment dummy patterns 320, the light reception alignment mark 124 may be disposed anywhere without the need to avoid overlapping with the lower patterns 420.

The alignment dummy pattern 320 may include an upper dummy pattern 322 and a lower dummy pattern 324 that are disposed in the peripheral insulation portion of the upper insulation layer 300 and alternately formed along at least one of a vertical or horizontal direction. If the upper insulation layer 300 includes multiple layers that are stacked on one another, the upper dummy pattern 322 and the lower dummy pattern 324 may be positioned in different layers of the upper insulation layer 300.

Figure 5A:
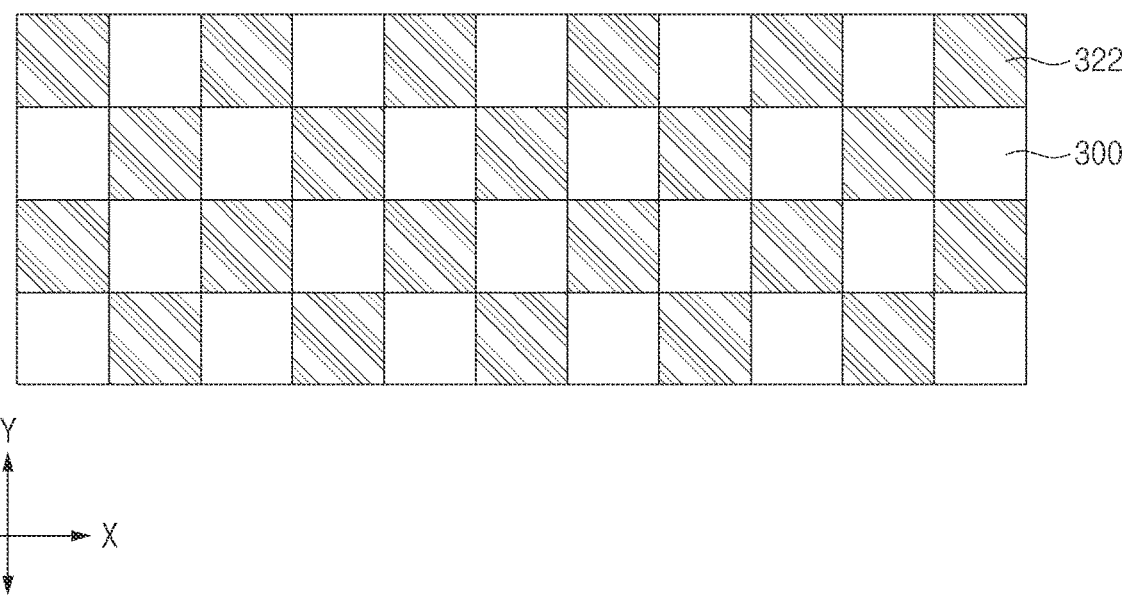
FIG. 5A is a schematic diagram illustrating an example of a layout structure of upper dummy patterns in an alignment dummy pattern based on some implementations of the disclosed technology.
Figure 5B:
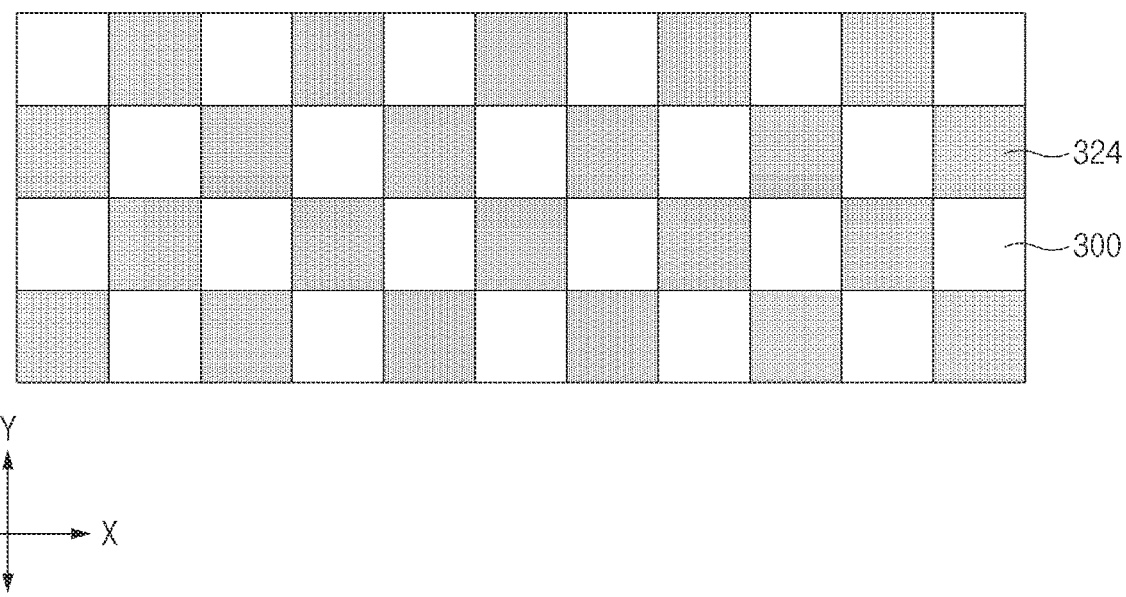
FIG. 5B is a schematic diagram illustrating an example of a layout structure of lower dummy patterns in an alignment dummy pattern based on some implementations of the disclosed technology.

FIG. 5A is a schematic diagram illustrating an example of a layout structure of upper dummy patterns in the alignment dummy pattern based on some implementations of the disclosed technology. FIG. 5B is a schematic diagram illustrating an example of a layout structure of lower dummy patterns in the alignment dummy pattern based on some implementations of the disclosed technology.

Referring to FIGS. 5A and 5B, the upper dummy patterns 322 and the lower dummy patterns 324 may be formed in a shape in which dot patterns, each of which is formed in a square shape, are alternately arranged in an X-axis direction and a Y-axis direction. For example, the upper dummy patterns 322 and the lower dummy patterns 324 may be formed in a manner that a plurality of dot patterns having the same size (i.e., the same horizontal and vertical lengths) are arranged in a checkerboard pattern.

In this case, the upper dummy patterns 322 and the lower dummy patterns 324 may be formed in different layers. For example, the upper dummy patterns 322 may be formed in a metal layer M3, and the lower dummy patterns 324 may be formed in a metal layer M4. The upper dummy patterns 322 may be formed simultaneously with formation of conductive lines 310 of the metal layer M3, and the lower dummy patterns 324 may be formed simultaneously with formation of the conductive lines 310 of the metal layer M4. The dot patterns of the upper dummy patterns 322 and the dot patterns of the lower dummy patterns 324 may include a metal such as copper (Cu).

Figure 6:
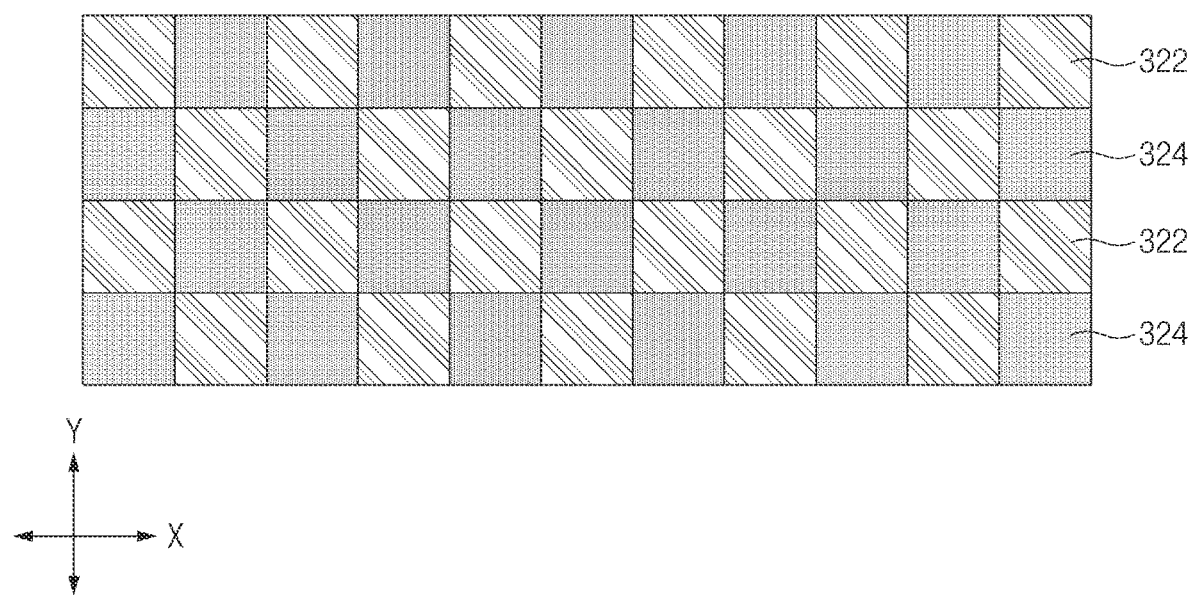
FIG. 6 is a schematic diagram illustrating an example of a situation in which an upper dummy pattern and a lower dummy pattern overlap with each other based on some implementations of the disclosed technology.

Specifically, the dot patterns of the upper dummy patterns 322 and the dot patterns of the lower dummy patterns 324 may be alternately located. Thus, the dot patterns of the upper dummy patterns 322 and the dot patterns of the lower dummy patterns 324 may be disposed at staggered positions. For example, the dot patterns of the upper dummy patterns 322 may be arranged to vertically overlap with the insulation layer disposed between the dot patterns of the lower dummy patterns 324. Therefore, the appearance in which the upper dummy patterns 322 overlap with the lower dummy patterns 324 may be denoted by a shape such as one wide board as shown in FIG. 6.

As is apparent from the above description, the image sensing device based on some implementations of the disclosed technology can freely form alignment marks required for a subsequent process regardless of the position of lower patterns.

Although a number of illustrative embodiments have been described, it should be understood that various modifications to the disclosed embodiments and other embodiments can be devised based on what is described and/or illustrated in this patent document.

What is claimed is:
1. An image sensing device, comprising:
an upper substrate configured to include a pixel region and a first peripheral region located outside the pixel region, the pixel region including unit pixels configured to generate electrical signals through conversion of incident light;
a lower substrate configured to include a logic region and a second peripheral region located outside the logic region, the logic region coupled to receive the electrical signals from the unit pixels and configured to generate an image based on the electrical signals from the unit pixels;
light reception elements disposed over a first surface of the upper substrate, and configured to transmit the incident light to the pixel region;
an insulation layer disposed over a second surface located opposite to the first surface of the upper substrate and between the upper substrate and the lower substrate;

a light reception alignment mark disposed in the first peripheral region of the upper substrate and configured to assist positioning of the light reception elements formed over the first surface of the upper substrate in the pixel region; and an alignment pattern disposed between the first peripheral region and the second peripheral region and in the insulation layer, the alignment pattern disposed to overlap with the light reception alignment mark disposed in the first peripheral region and configured to absorb light used to measure the light reception alignment mark, and wherein the alignment pattern is disposed not to overlap with the pixel region.

2. The image sensing device according to claim 1, wherein the light reception alignment mark includes:
a trench that is etched to a predetermined depth from the first surface in the first peripheral region; and
an insulation material buried in the trench,
wherein the first surface is a surface on which light is incident.

3. The image sensing device according to claim 1, wherein the alignment pattern includes:
a plurality of dot patterns that are alternately disposed in the insulation layer.

4. The image sensing device according to claim 3, wherein the plurality of dot patterns includes first dot patterns disposed in a first layer and second dot patterns disposed in a second layer disposed under the first layer.

5. The image sensing device according to claim 4, wherein the first dot patterns and the second dot patterns are disposed at staggered positions in a checkerboard shape, the alignment pattern configured to overlap an entirety of the light reception alignment mark.

6. The image sensing device according to claim 3, wherein the plurality of dot patterns is of an equal size.

7. The image sensing device according to claim 3, wherein each dot pattern includes copper (Cu).

8. The image sensing device according to claim 1, wherein the insulation layer includes:
an upper insulation layer formed over a second surface located opposite to the first surface and formed to include the alignment pattern; and
a lower insulation layer formed over a first surface of the lower substrate to be in contact with the upper insulation layer.

9. The image sensing device according to claim 8, wherein the lower insulation layer includes additional patterns.

10. The image sensing device according to claim 9, wherein the alignment pattern is disposed to overlap with the additional patterns.

11. The image sensing device according to claim 1, wherein each light reception element includes a lens or filter.

12. An image sensing device comprising:
a semiconductor substrate configured to include a pixel region and a peripheral region located outside the pixel region, the pixel region including a plurality of photo-electric conversion elements configured to generate electrical signals through conversion of light;

a plurality of light reception elements formed over a first surface of the semiconductor substrate, and configured to transmit incident light to the plurality of photoelectric conversion elements;

an insulation layer disposed over a second surface located opposite to the first surface;

a light reception alignment mark disposed in the peripheral region of the semiconductor substrate, and configured to assist positioning of the plurality of light reception elements; and an alignment pattern formed in the insulation layer and disposed to overlap with the light reception alignment mark, wherein the alignment pattern includes a plurality of dot patterns that are disposed in different sub-layers of the insulation layer, and wherein the alignment pattern is disposed not to overlap with the pixel region.

13. The image sensing device according to claim 12, wherein the alignment pattern includes:
first dot patterns disposed in a first sub-layer of the insulation layer; and
second dot patterns disposed in a second sub-layer disposed under the first sub-layer.

14. The image sensing device according to claim 13, wherein the first dot patterns and the second dot patterns are disposed at staggered positions in a checkerboard shape, the alignment pattern configured to overlap an entirety of the light reception alignment mark.

15. The image sensing device according to claim 13, wherein the first dot patterns and the second dot patterns have a same size.

16. The image sensing device according to claim 12, wherein the plurality of dot patterns includes a metal.

17. The image sensing device according to claim 12, wherein the insulation layer includes:
an upper insulation layer formed over the second surface located opposite to the first surface and formed to include the alignment pattern; and
a lower insulation layer formed to be in contact with the upper insulation layer.

18. The image sensing device according to claim 12, further comprising an additional substrate disposed under the insulation layer and configured to include a logic region configured to generate an image upon receiving the electrical signals from the pixel region.

19. The image sensing device according to claim 17, wherein the lower insulation layer includes additional patterns, and the alignment pattern is disposed to overlap with the additional patterns.

20. The image sensing device according to claim 12, wherein each light reception element includes a lens or filter.

* * * * *